(12) United States Patent
Kobayashi et al.

(10) Patent No.: US 9,859,149 B2
(45) Date of Patent: Jan. 2, 2018

(54) METHOD OF PRODUCING BONDED WAFER WITH UNIFORM THICKNESS DISTRIBUTION

(71) Applicant: SHIN-ETSU HANDOTAI CO., LTD., Tokyo (JP)

(72) Inventors: Norihiro Kobayashi, Takasaki (JP); Hiroji Aga, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 14/895,184

(22) PCT Filed: May 19, 2014

(86) PCT No.: PCT/JP2014/002615
§ 371 (c)(1),
(2) Date: Dec. 1, 2015

(87) PCT Pub. No.: WO2014/207988
PCT Pub. Date: Dec. 31, 2014

(65) Prior Publication Data
US 2016/0118294 A1     Apr. 28, 2016

(30) Foreign Application Priority Data

Jun. 26, 2013 (JP) ................................. 2013-133868

(51) Int. Cl.
*H01L 21/78* (2006.01)
*H01L 21/02* (2006.01)
(Continued)

(52) U.S. Cl.
CPC .. *H01L 21/76254* (2013.01); *H01L 21/02032* (2013.01); *H01L 21/324* (2013.01); *H01L 21/7813* (2013.01); *H01L 22/12* (2013.01)

(58) Field of Classification Search
CPC ....... H01L 21/30; H01L 21/46; H01L 21/762; H01L 21/7813
See application file for complete search history.

(56) References Cited

U.S. PATENT DOCUMENTS 4,963,505 A * 10/1990 Fujii ..................... H01L 21/762
148/DIG. 12
5,374,564 A    12/1994 Bruel
(Continued)

FOREIGN PATENT DOCUMENTS

CN        101490806 A    7/2009
EP          2770524 A1    8/2014
(Continued)

OTHER PUBLICATIONS

Aug. 19, 2014 Search Report issued in International Patent Application No. PCT/JP2014/002615.
(Continued)

*Primary Examiner* — Benjamin Sandvik
*Assistant Examiner* — Gustavo Ramallo
(74) *Attorney, Agent, or Firm* — Oliff PLC

(57) ABSTRACT

Method of producing bonded wafer including thin film on base wafer, including: implanting at least one gas ion selected from hydrogen ion and rare gas ion into bond wafer from surface of bond wafer to form layer of implanted ion; bonding surface from which ion is implanted into bond wafer and surface of base wafer directly or through insulator film; and then performing heat treatment to separate part of bond wafer along layer of implanted ion, wherein before bond wafer and base wafer are bonded, thickness of bond wafer and base wafer is measured, and combination of bond wafer and base wafer is selected such that difference in thickness between the wafers is less than 5 μm, and selected bond and base wafers are bonded. This method can inhibit variation in thickness in marble pattern that occurs in thin
(Continued)

film and produce bonded wafer including thin film with uniform thickness.

4 Claims, 3 Drawing Sheets

(51) Int. Cl.
*H01L 21/762* (2006.01)
*H01L 21/324* (2006.01)
*H01L 21/66* (2006.01)

(56) References Cited

U.S. PATENT DOCUMENTS

| | | |
|---|---|---|
| 6,596,610 B1 | 7/2003 | Kuwabara et al. |
| 2006/0099776 A1 | 5/2006 | Dupont |
| 2006/0118935 A1* | 6/2006 | Kamiyama ....... H01L 21/30608 257/684 |
| 2008/0124929 A1 | 5/2008 | Okuda et al. |
| 2009/0209085 A1 | 8/2009 | Tamura et al. |
| 2014/0027340 A1 | 9/2014 | Ishizuka et al. |
| 2014/0273400 A1 | 9/2014 | Ishizuka et al. |

FOREIGN PATENT DOCUMENTS

| | | |
|---|---|---|
| JP | H05-211128 A | 8/1993 |
| JP | 2001-155978 A | 6/2001 |
| JP | 2004-311526 A | 11/2004 |
| JP | 2006-140445 A | 6/2006 |
| JP | 2007-149907 A | 6/2007 |
| JP | 2008-021892 A | 1/2008 |
| WO | 2013/057865 A1 | 4/2013 |

OTHER PUBLICATIONS

Dec. 29, 2015 International Preliminary Report on Patentability issued in International Patent Application No. PCT/JP2014/002615.
Jul. 27, 2016 Search Report issued in Taiwanese Patent Application No. 103120720.
Jul. 27, 2016 Office Action issued in Taiwanese Patent Application No. 103120720.
Feb. 24, 2017 Office Action issued in Chinese Patent Application No. 201480032979.9.
Jan. 30, 2017 Search Report issued in European Patent Application No. 14818587.9.

* cited by examiner

METHOD OF PRODUCING BONDED WAFER WITH UNIFORM THICKNESS DISTRIBUTION

TECHNICAL FIELD

The present invention relates to a method of producing a bonded wafer by an ion implantation separation method, and particularly to a method of producing a bonded wafer by the ion implantation separation method by using a wafer reclaimed by performing a reclaiming process on a by-product wafer separated when a bonded wafer is produced by the ion implantation separation method.

BACKGROUND ART

A method for producing SOI wafers by separating ions-implanted wafers after bonding, i.e., the ion implantation separation method (an art also referred to as the Smart Cut method (registered trademark)), has attracted attention as a method for producing SOI wafers, particularly SOI wafers each having a thin layer that enable the performance improvements of advanced integrated circuits.

The ion implantation separation method is an art (See Patent Document 1) to form an SOI wafer in the following manner: an oxide film is formed on at least one of two silicon wafers, and gas ions, such as hydrogen ions or rare gas ions, are implanted from a front surface of one of the silicon wafers (a bond wafer) to form a layer of the implanted ions (also referred to as a micro bubble layer or an enclosed layer) in the interior of the wafer. The oxide film is then interposed between the surface from which the ions are implanted and the other silicon wafer (a base wafer) so that these have close contact, and a heat treatment (a separation heat treatment) is then performed to cleave one of the wafers (the bond wafer) along the micro bubble layer so that the bond wafer is separated into a thin film. A heat treatment (a bonding heat treatment) is then performed to strengthen a bond between the wafers. At this point, the cleave surface (the separation surface) is a surface of an SOI layer and an SOI wafer having a thin SOI film with high uniformity is relatively readily obtained.

This ion implantation separation method is used not only to produce a bonded SOI wafer through an insulator film but also to produce a bonded wafer by directly bonding two wafers.

In the ion implantation separation method, the separated bond wafer is subjected to a reclaiming process (a refreshing process) including a surface treatment such as polishing and etching again. This process reduces or eliminates a step created at a non-bonding part, rough surface after the separation, and an effect of a layer of residual implanted ions, allowing repeated reuse of the wafer. Patent Document 2 for example suggests a reclaiming process of eliminating the effect of the implanted-ions layer remaining in a chamfered portion by the combination of chamfering and polishing.

Patent Document 3 discloses a reclaiming process performed on the separated wafer that includes polishing the surface of the wafer with a polishing stock removal of 2 μm or more, and repeated reuse of the separated wafers as bond wafers. Patent Document 4 discloses that when the separated wafer is repeatedly reused, about 5 μm of polishing is repeated 10 times at its maximum. Patent Document 5 discloses the polishing stock removal of the surface of the separated wafer ranges from 1 to 5 μm or is more than that, and a reclaiming process on the separated wafer is repeated several times.

CITATION LIST

Patent Literature

Patent Document 1: Japanese Unexamined Patent publication (Kokai) No. H05-211128
Patent Document 2: Japanese Unexamined Patent publication (Kokai) No. 2001-155978
Patent Document 3: Japanese Unexamined Patent publication (Kokai) No. 2008-21892
Patent Document 4: Japanese Unexamined Patent publication (Kokai) No. 2006-140445
Patent Document 5: Japanese Unexamined Patent publication (Kokai) No. 2007-149907

SUMMARY OF INVENTION

Technical Problem

When the thickness distribution of the SOI layer of a bonded SOI wafer produced by the ion implantation separation method is measured, a variation in thickness in a marble pattern may be seen. This variation in thickness is also visually observed in appearance inspection of the SOI layer surface after the bond wafer is separated, and forms a pattern in millimeters.

In recent years, standards in thickness distribution of an SOI layer become increasingly strict, and it is important to eliminate a variation in thickness with a large pattern that occurs during the separation process. This variation in thickness, particularly in SOI wafers having an SOI layer thickness of 30 nm or less that are called extremely thin SOI (ETSOI), greatly affects their production yield. It is accordingly desired to prevent the occurrence of this variation.

The present invention was accomplished in view of the above-described problems. It is an object of the present invention to inhibit the variation in thickness in a marble pattern that occurs in a thin film when a bonded wafer is produced by the ion implantation separation method and to produce a bonded wafer including the thin film with uniform thickness.

Solution to Problem

To achieve this object, the present invention provides a method of producing a bonded wafer including a thin film on a base wafer, comprising: implanting at least one gas ion selected from a hydrogen ion and a rare gas ion into a bond wafer from a surface of the bond wafer to form a layer of the implanted ion; bonding the surface from which the ion is implanted into the bond wafer and a surface of the base wafer directly or through an insulator film; and then performing a heat treatment to separate part of the bond wafer along the layer of the implanted ion, wherein before the bond wafer and the base wafer are bonded, a thickness of the bond wafer and the base wafer is measured, and a combination of the bond wafer and the base wafer is selected such that a difference in the thickness between the wafers is less than 5 μm, and the selected bond and base wafers are bonded.

Such a producing method can inhibit the variation in thickness of the thin film and produce the bonded wafer including the thin film with uniform thickness.

At least one of the bond wafer and the base wafer can be a wafer reclaimed by performing a reclaiming process including a thickness reducing process on a by-product wafer separated when a bonded wafer is produced by the producing method. This reclaimed wafer can be subjected to the reclaiming process including the thickness reducing process twice or more, or the reclaiming process including the thickness reducing process that reduces the thickness of the reclaimed wafer by 5 µm or more.

The invention can be preferably applied particularly when the reclaimed wafer, which readily causes the variation in thickness, is used, and produce the bonded wafer including the thin film with uniform thickness at a reduced cost.

The bond wafer and the base wafer are silicon single crystal wafers, the insulator film is a silicon oxide film, and the thin film is an SOI layer.

In this manner, an SOI wafer having a thin SOI layer with uniform thickness can be produced.

Advantageous Effects of Invention

A method of producing a bonded wafer according to the invention can inhibit the variation in thickness of the thin film and produce a bonded wafer including the thin film with uniform thickness, because before the bond wafer and the base wafer are bonded, the thickness of the bond wafer and the base wafer is measured, and combination of the bond wafer and the base wafer is selected such that a difference between the thickness of the wafers is less than 5 µm.

DESCRIPTION OF EMBODIMENTS

Figure 1:
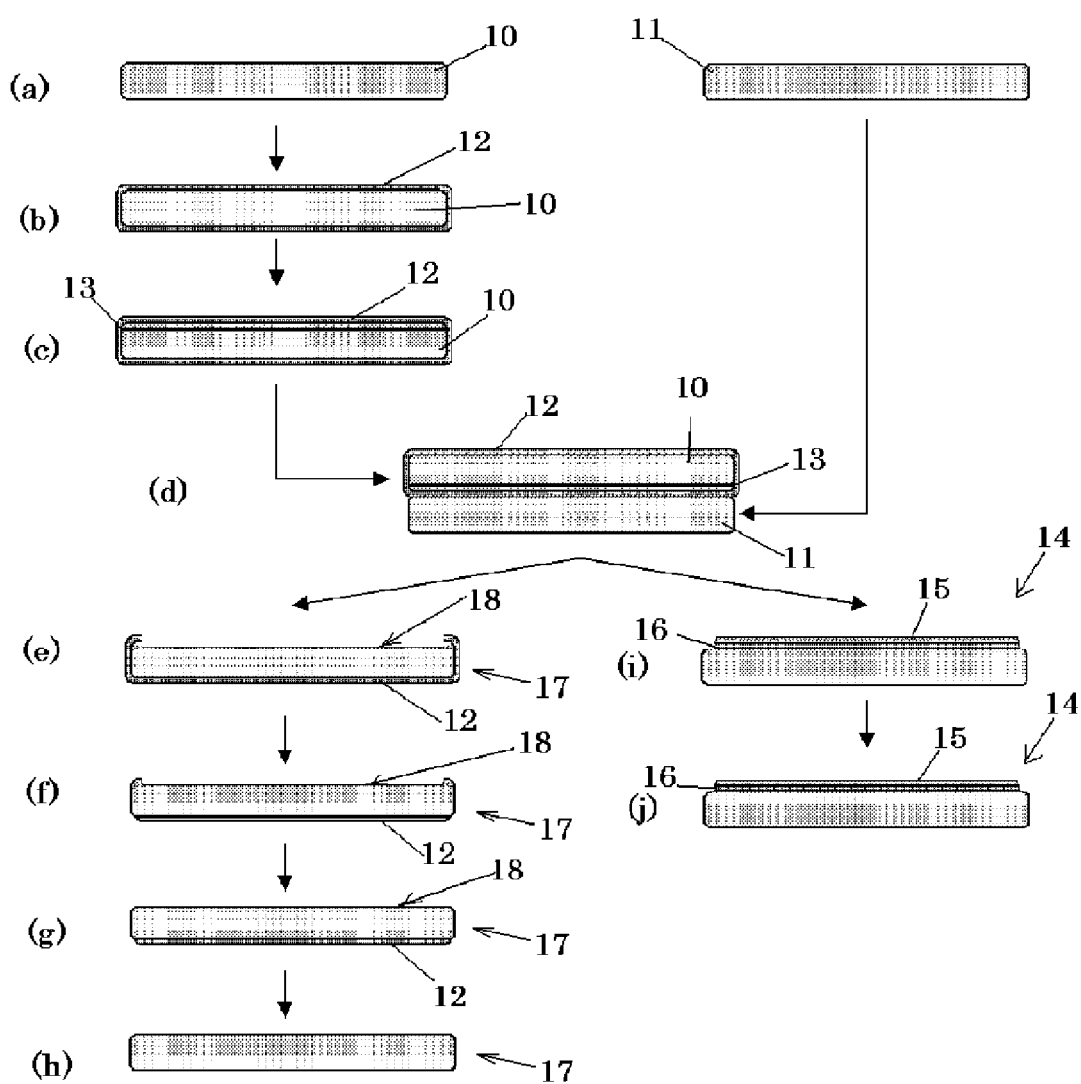
FIG. 1 is a flowchart of an example of the inventive method of producing a bonded wafer.

An embodiment of the present invention will hereinafter be described, but the invention is not limited to this embodiment.

When a bonded SOI wafer is produced by the ion implantation separation method, a reclaimed wafer is usually used as a bond wafer or base wafer to reduce cost; this reclaimed wafer is obtained by performing a reclaiming process including a thickness reducing process on a by-product wafer separated when a bonded wafer is produced. Alternatively, an unused wafer (a wafer that has not yet been subjected to the reclaiming process, referred to as a prime wafer below) may be used as the bond wafer and base wafer.

In production of a bonded SOI wafer by the ion implantation separation method, the variation in thickness in a marble pattern occurs in the SOI layer of the bonded SOI wafer, as described above. The inventors investigated this problem in detail and found the following.

When the prime wafer is used as the bond wafer and the base wafer, if these wafers are produced in different production lots, then the variation in thickness of the SOI layer frequently occurs. If at least one of the bond wafer and the base wafer is a reclaimed wafer, then the variation in thickness more frequently occurs. As the number of the reclaiming increases, the frequency of occurrence is apt to increase. The inventors accordingly conducted the following experiment with the prime wafer and reclaimed wafer and considered the tendency for the frequency of occurrence to increase as follows.

In general, the thickness of silicon single crystal wafers used as a bond wafer and a base wafer has a variation within ±15 µm as a standard. In fact, the variation in thickness among the wafers is about plus or minus several microns when these wafers belong to the same production lot. Accordingly, use of the prime wafers, particularly produced in the same production lot, almost reduces the possibility that the variation in thickness occurs. When their production lots and the median thickness of the wafers are different, however, the difference in thickness of the wafers may exceed 5 µm even for the prime wafers, and the variation in thickness thereby frequently occurs.

When at least one of the bond wafer and the base wafer is a reclaimed wafer, the possibility that the difference in thickness between the wafers exceeds 5 µm increases because the reclaimed wafer has been thinned through the thickness reducing process. In particular, when one of the bond wafer and the base wafer is a prime wafer and the other wafer is a reclaimed wafer, there is a strong possibility that this occurs. Accordingly, the frequency of occurrence of the variation in thickness increases.

(Experiment)

Four mirror-polished wafers made of silicon single crystal having a diameter of 300 mm, a crystal orientation of <100> and a thickness shown in Table 1 were prepared to be used as the bond wafer and base wafer. The thickness of the wafers was an average value (the first decimal place was rounded off) obtained by measurement on the entire wafer surface with a measurement apparatus of electrostatic capacity type.

TABLE 1

| Symbol | Wafer type | Wafer thickness | Number of reclaiming |
|---|---|---|---|
| P (780) | prime wafer | 780 µm | 0 |
| P (775) | prime wafer | 775 µm | 0 |
| R (760) | reclaimed wafer | 760 µm | 1 |
| R (740) | reclaimed wafer | 740 µm | 2 |

These four wafers were used as the bond wafer and the base wafer to produce a bonded SOI wafer under the following conditions by the ion implantation separation method. The thickness of the SOI layer was then measured with a measurement apparatus (Acumap made by KLA-Tencor) to evaluate the occurrence of variation in thickness. The result is shown in Table 2.

The conditions under which the bonded SOI wafer was produced will now be described.

[Production Conditions of Bonded SOI Wafer]

Oxide film: a thermal oxide film with a thickness of 55 nm was formed on the bond wafer; no oxide film was formed on the base wafer, Conditions of hydrogen ion implantation: an implantation energy of 48.7 keV; a dose amount of $5 \times 10^{16}/cm^2$, Separation heat treatment: a heat treatment at 350° C. for 4 hours and a heat treatment at 500° C. for 30 minutes under an argon atmosphere, Flattening heat treatment: a heat treatment at 1,200° C. for 1 hour under an argon atmosphere, Adjustment of SOI film thickness: the thickness of SOI layer was decreased to about 70 nm by a sacrificial oxidation treatment.

TABLE 2

| bond wafer | base wafer | | | |
|---|---|---|---|---|
| | P (780) | P (775) | R (760) | R (740) |
| P (780) | ○ | X | X | X |
| P (775) | X | ○ | X | X |
| R (760) | X | X | ○ | X |
| R (740) | X | X | X | ○ |

The result in Table 2 revealed that when the difference in thickness between the bond wafer and the base wafer was 5 μm or more, the variation in thickness of the SOI layer occurred. The symbol "○" in Table 2 means that no variation in thickness occurred; the symbol "x" means that the variation in thickness occurred.

It has not been made clear how the difference in thickness between the bond wafer and the base wafer relates to the occurrence of the variation in thickness. It is however presumed that when the separation heat treatment is performed to separate the wafer, the difference in eigenfrequency at the separated area due to the difference in thickness causes the variation in thickness.

Thus, the inventors found that the occurrence of the variation in thickness is due to a large difference in thickness between the bond wafer and the base wafer, thereby brought the invention to completion.

A method of producing a bonded wafer according to the invention will now be described with reference to FIG. 1.

In the invention, an SOI wafer having an SOI layer formed on a silicon oxide film on a silicon single crystal wafer, for example, can be produced as a bonded wafer including a thin film on the base wafer.

As shown in FIG. 1 (a), the bond wafer 10 and the base wafer 11 are first prepared. In this preparation, from plural wafers whose thickness has previously been measured, a combination of the bond wafer and the base wafer is selected such that the difference in thickness between these wafers is less than 5 μm, preferably 3 μm or less. This selecting process may be performed before a process of bonding the bond wafer and the base wafer, but not limited by the order of implementation among other processes before the bonding process. The selecting process may be performed, for example, after a process of forming a layer of implanted ions in the bond wafer, as described below.

In this manner, the bond wafer and the base wafer are selected such that the difference in thickness between these wafers is less than 5 μm and then bonded in the later-described manner. This method enables the inhibition of the occurrence of variation in thickness of the thin film after the separation, and production of a bonded wafer having highly uniform thin film thickness.

At this time, the prime wafer or reclaimed wafer can be used as the bond wafer and the base wafer. Alternatively, one of the bond wafer and the base wafer can be the prime wafer and the other can be the reclaimed wafer. It is to be noted that the reclaimed wafer is a by-product wafer that is separated when a bonded wafer is produced and then subjected to a reclaiming process including a thickness reducing process. Use of the reclaimed wafer is preferred because the cost can be reduced. The inventive method of producing a bonded wafer can inhibit the variation in thickness of the thin film even when the reclaimed wafer, which is likely to cause the variation in thickness of the thin film in conventional methods, is used, particularly even when the reclaimed wafer has been subjected to the reclaiming process including the thickness reducing process twice or more, in other words, the reclaimed wafer has been reused twice or more, or the reclaimed wafer has been subjected to the reclaiming process including the process of reducing the thickness by 5 μm or more.

As shown in FIG. 1 (b), an oxide film 12 that will be a buried oxide film 16 is then grown on the bond wafer 10 by thermal oxidation, chemical vapor deposition (CVD), or another process. Alternatively, the oxide film 12 may be formed on both the wafers or only on the base wafer 11. If a directly bonded wafer is produced, it is unnecessary to form this oxide film.

As shown in FIG. 1 (c), at least one type of gas ions selected from hydrogen ions and rare gas ions are then implanted from above the oxide film 12 with an ion implantation apparatus, so that a layer 13 of the implanted ions is formed in the interior of the bond wafer 10. In this process, an accelerating voltage of the ion implantation is selected such that a separated silicon (thin film 15) having a target thickness can be obtained.

As shown in FIG. 1 (d), the bond wafer 10 after the ion implantation is brought into close contact with the base wafer 11 such that the surface from which the ions have been implanted comes in contact with the base wafer.

A heat treatment to produce a micro bubble layer in the layer 13 of the implanted ions is then performed on the bonded wafer at temperatures from 350° C. to 500° C. This wafer is divided along the micro bubble layer. As shown in FIG. 1 (i), the bonded wafer 14 having the thin film 15 and the buried oxide film 16 formed above the base wafer 11 is thereby produced.

Before the bonding process, the surfaces to be bonded can be subjected to a plasma treatment to enhance the bonding strength of the wafers that have been brought into close contact with each other at room temperature.

As shown in FIG. 1 (j), this bonded wafer 14 can be subjected to the flattening heat treatment, bonding heat treatment, polishing, and other processes to flatten the separated surface and to enhance the bonding strength.

As shown in FIG. 1 (e), a separated by-product wafer 17 is created from the bonded wafer 10 after the separation in the course of the production. This separated by-product wafer 17 has a step that has not attached to the base wafer 11 at an outer circumference portion on the separated surface 18. A reclaiming process to remove this step etc., allows the separated by-product wafer 17 to be reused as a reclaimed wafer in next production of a bonded wafer. This reclaiming process can be performed on the separated by-product wafer 17, for example, in the following manner.

As shown in FIG. 1 (f), part of the oxide film except the oxide film formed on the surface opposite to the separated surface 18 is removed by cleaning, for example, by an HF solution. As shown in FIG. 1 (g), the separated surface is then polished to flatten this surface and remove a damaged layer due to the ion implantation. As shown in FIG. 1 (h), the wafer is then cleaned by being immersed in an HF solution in a normal batch manner to remove the oxide film 12 remaining on the back surface. In this way, the reclaimed wafer can be produced with the same front and back surfaces quality as the prime wafer. This reclaiming process makes the thickness of the reclaimed wafer thinner than the original thickness of the bond wafer.

EXAMPLE

The present invention will be more specifically described below with reference to examples and comparative examples, but the invention is not limited to these examples.

Examples 1 to 5 and Comparative Examples 1 to 5

A bonded SOI wafer was produced by using mirror-polished silicon single crystal wafers having a crystal orientation of <100> and a diameter of 300 mm as the bond and base wafers, and presence or absence of occurrence of variation in thickness of its SOI layer was evaluated. Table 3 shows the type, thickness, and reclaiming conditions of the bond and base wafers used in examples 1 to 5 and comparative examples 1 to 5. The reclaiming conditions are shown by Reclaiming number that represents the number of times the reclaimed wafer had been used so far and Reclaiming polishing stock removal that represents a polishing stock removal in polishing for the reclaiming. In examples 1 to 5, the combination of the bond wafer and the base wafer was selected such that the difference in thickness between these wafers that was measured in advance was less than 5 µm, and the selected wafers were bonded.

Figure 2:
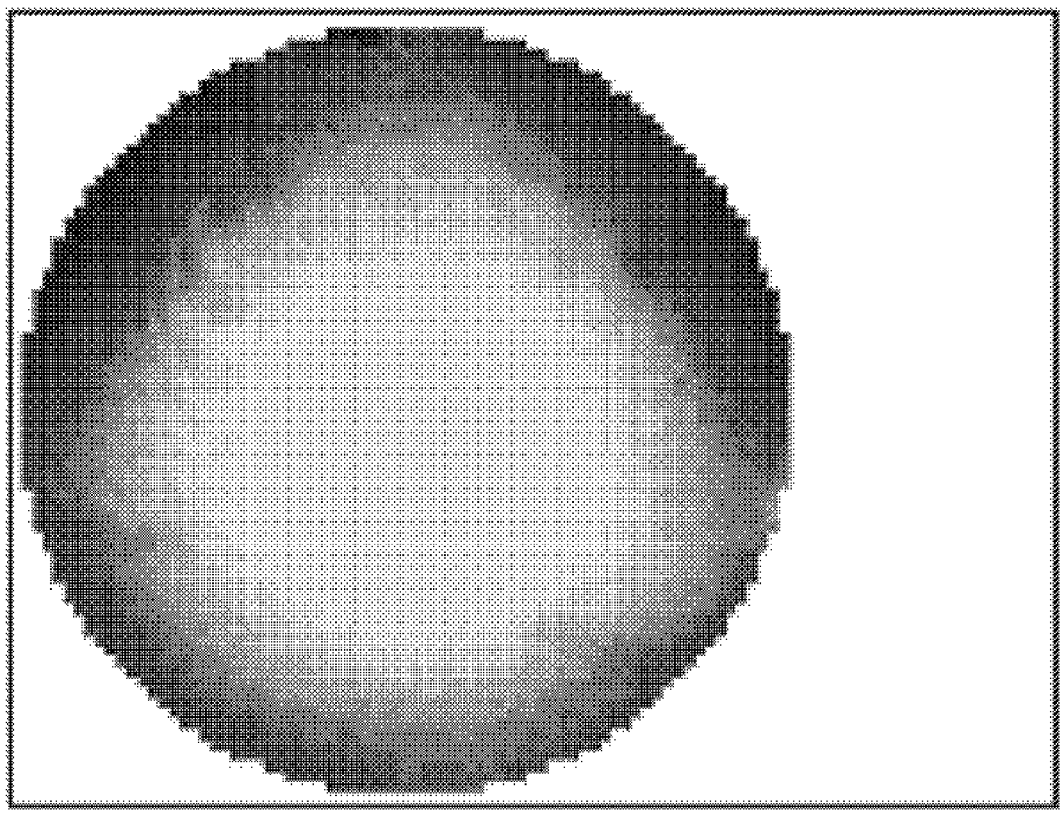
FIG. 2 is a diagram showing a typical example of an SOI wafer with no variation in thickness in Examples 1 to 5.
Figure 3:
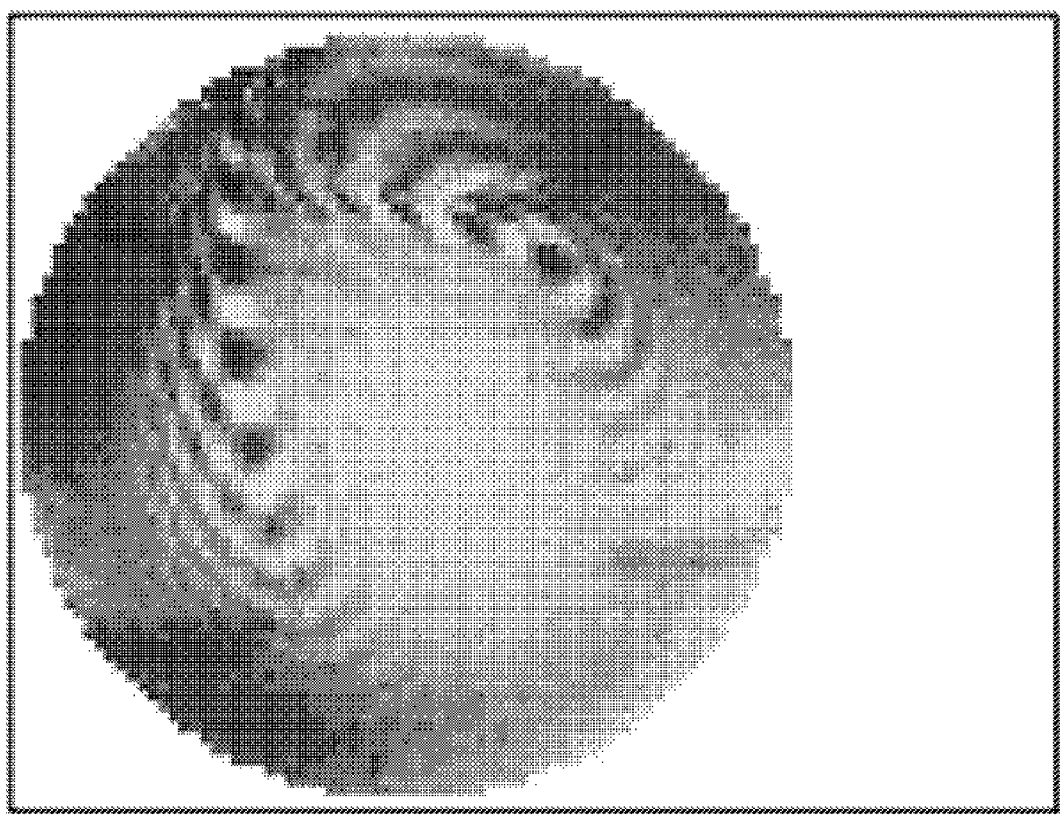
FIG. 3 is a diagram showing a typical example of an SOI wafer with a variation in thickness in Comparative Examples 1 to 5.

The result of the variation in thickness is shown in Table 3. The symbol "○" in Table 3 means that no variation in thickness occurred; the symbol "x" means that the variation in thickness occurred. As shown in Table 3, no variation in thickness occurred in examples 1 to 5; the variation in thickness occurred in comparative examples 1 to 5. FIG. 2 shows a typical example of an SOI wafer with no variation in thickness in Examples 1 to 5. FIG. 3 shows a typical example of an SOI wafer with a variation in thickness in comparative examples 1 to 5.

The range of thickness of the SOI layer of wafers in comparative examples 1 to 5 in which the variation in thickness occurred was about 1.5 to 2.5 nm; the range of thickness of the SOI layer of wafers in examples 1 to 5 in which no variation in thickness occurred was about 1.2 to 1.8 nm, which was good result. This range was obtained by subtracting the minimum from the maximum of an in-plane film thickness.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

For example, the above embodiment is described as the case where the bonded SOI wafer is produced by interposing the insulator film. The invention however can be applied to the case where a bonded wafer is produced by directly bonding two wafers.

The invention claimed is:

1. A method of producing a bonded wafer including a thin film on a silicon single crystal base wafer, the method comprising:
    implanting at least one gas ion selected from the group consisting of a hydrogen ion and a rare gas ion into a silicon single crystal bond wafer from a surface of the bond wafer to form a layer of the implanted ion;
    bonding the surface from which the ion is implanted into the bond wafer and a surface of the base wafer directly or through an insulator film; and
    then performing a heat treatment to separate part of the bond wafer along the layer of the implanted ion to form the bonded wafer, wherein
    at least one of the bond wafer and the base wafer is a wafer reclaimed by performing a reclaiming process including a thickness reducing process on a by-product wafer separated when the bonded wafer is formed,
    the reclaiming process including the thickness reducing process reduces the thickness of the reclaimed wafer by 5 µm or more, and
    before the bond wafer and the base wafer are bonded, a thickness of the bond wafer and the base wafer is measured, and a combination of the bond wafer and the base wafer is selected such that a difference in the thickness between the wafers is less than 5 µm, and the selected bond and base wafers are bonded.

TABLE 3

|  |  | Type | Thickness (µm) | Reclaiming number | Reclaiming polishing stock removal | Variation in thickness |
|---|---|---|---|---|---|---|
| Example 1 | bond wafer | prime | 775 | 0 | 0 | ○ |
|  | base wafer | prime | 772 | 0 | 0 |  |
| Example 2 | bond wafer | reclaimed | 772 | 1 | 3 µm | ○ |
|  | base wafer | prime | 775 | 0 | 0 |  |
| Example 3 | bond wafer | reclaimed | 769 | 2 | 3 µm × 2 | ○ |
|  | base wafer | prime | 772 | 0 | 0 |  |
| Example 4 | bond wafer | reclaimed | 763 | 3 | 4 µm × 3 | ○ |
|  | base wafer | reclaimed | 767 | 2 | 4 µm × 2 |  |
| Example 5 | bond wafer | prime | 775 | 0 | 0 | ○ |
|  | base wafer | reclaimed | 771 | 1 | 4 µm |  |
| Comparative Example 1 | bond wafer | prime | 775 | 0 | 0 | X |
|  | base wafer | prime | 770 | 0 | 0 |  |
| Comparative Example 2 | bond wafer | reclaimed | 770 | 1 | 5 µm | X |
|  | base wafer | prime | 775 | 0 | 0 |  |
| Comparative Example 3 | bond wafer | reclaimed | 769 | 2 | 3 µm × 2 | X |
|  | base wafer | prime | 775 | 0 | 0 |  |
| Comparative Example 4 | bond wafer | reclaimed | 766 | 3 | 3 µm × 3 | X |
|  | base wafer | reclaimed | 774 | 1 | 3 µm |  |
| Comparative Example 5 | bond wafer | prime | 775 | 0 | 0 | X |
|  | base wafer | reclaimed | 770 | 1 | 5 µm |  |

2. The method according to claim 1, wherein the reclaimed wafer is subjected to the reclaiming process including the thickness reducing process twice or more.

3. The method according to claim 1, wherein the insulator film is a silicon oxide film, and the thin film is an SOI layer.

4. The method according to claim 2, wherein the insulator film is a silicon oxide film, and the thin film is an SOI layer.

* * * * *